US012672383B2

(12) United States Patent
Zhao et al.

(10) Patent No.: US 12,672,383 B2
(45) Date of Patent: Jun. 30, 2026

(54) BACK-CONTACT SOLAR CELL

(71) Applicant: LONGI SOLAR TECHNOLOGY (TAIZHOU) CO., LTD., Taizhou (CN)

(72) Inventors: Xueliang Zhao, Taizhou (CN); Weiming Lu, Taizhou (CN); Zhonglan Li, Taizhou (CN); Zhilin Liang, Taizhou (CN); Hua Li, Taizhou (CN); Yupeng Jin, Taizhou (CN)

(73) Assignee: LONGi Solar Technology (Taizhou) Co., Ltd., Taizhou (CN)

( * ) Notice: Subject to any disclaimer, the term of this patent is extended or adjusted under 35 U.S.C. 154(b) by 0 days.

(21) Appl. No.: 18/825,297

(22) Filed: Sep. 5, 2024

(65) Prior Publication Data

US 2024/0429333 A1 Dec. 26, 2024

Related U.S. Application Data

(63) Continuation-in-part of application No. PCT/CN2023/100256, filed on Jun. 14, 2023.

(30) Foreign Application Priority Data

Aug. 22, 2022 (CN) .......................... 202222209376.6

(51) Int. Cl.
*H10F 77/14* (2025.01)
*H10F 77/20* (2025.01)
*H10F 77/70* (2025.01)

(52) U.S. Cl.
CPC ......... *H10F 77/147* (2025.01); *H10F 77/219* (2025.01); *H10F 77/70* (2025.01)

(58) Field of Classification Search
None
See application file for complete search history.

(56) References Cited

U.S. PATENT DOCUMENTS 4,689,438 A * 8/1987 Fukatsu ............ H01L 31/02366
136/258
4,918,030 A * 4/1990 Lamb ................ H01L 31/02363
257/E31.13

(Continued)

FOREIGN PATENT DOCUMENTS

CN 106531816 A * 3/2017 ........... H10F 77/219
CN 113394304 A * 9/2021 ......... H01L 31/0224

(Continued)

OTHER PUBLICATIONS

Machine translation of CN113394304A (Year: 2021).*

(Continued)

*Primary Examiner* — Tamir Ayad
(74) *Attorney, Agent, or Firm* — Fish & Richardson P.C.

(57) ABSTRACT

This application discloses a back contact solar cell, relating to the field of solar cell technologies. In one implementation, a back contact solar cell includes a semiconductor substrate, a first doped semiconductor layer, and a second doped semiconductor layer. The semiconductor substrate includes a first surface and a second surface opposite to the first surface. The second surface includes a first region having a first convex structure and a second region having a second convex structure. A morphology of a convex of the first convex structure is different from a morphology of a convex of the second convex structure. The first doped semiconductor layer is formed in or on the first region. The second doped semiconductor layer is formed in or on the second region. A conductivity type of the second doped semiconductor layer is opposite to a conductivity type of the first doped semiconductor layer.

21 Claims, 6 Drawing Sheets

(56) References Cited

U.S. PATENT DOCUMENTS

| | | | | |
|---|---|---|---|---|
| 2001/0050103 A1* | 12/2001 | Washio | ............. | H01L 31/02363 |
| | | | | 438/57 |
| 2012/0273036 A1* | 11/2012 | Motoyoshi | ............ | H10F 10/146 |
| | | | | 257/E31.032 |
| 2013/0102107 A1* | 4/2013 | Hirose | ................. | H10F 77/703 |
| | | | | 438/57 |

FOREIGN PATENT DOCUMENTS

| | | | |
|---|---|---|---|
| CN | 113964216 A | 1/2022 |
| CN | 115224137 A | 10/2022 |
| CN | 218975458 U | 5/2023 |
| CN | 116936658 A | 10/2023 |
| JP | 2022016977 A | 1/2022 |
| WO | 2013/125036 A1 | 8/2013 |

OTHER PUBLICATIONS

Machine translation of CN 106531816A (Year: 2017).*
International Preliminary Report on Patentability in International Appln. No. PCT/CN2023/100256, mailed on Mar. 6, 2025, 12 pages (with English translation).
International Search Report and Written Opinion in International Appln. No. PCT/CN2023/100256, mailed on Jul. 31, 2023, 13 pages (with English translation).
Extended European Search Report in European Appln. No. 23856212.8, mailed on May 27, 2025, 9 pages.
Office Action in European Appln. No. 23856212.8, mailed on Jun. 16, 2025, 1 page.

* cited by examiner

BACK-CONTACT SOLAR CELL

CROSS-REFERENCE TO RELATED APPLICATIONS

This application is a continuation-in-part of International Application No. PCT/CN2023/100256, filed on Jun. 14, 2023, which claims priority to Chinese Patent Application No. 202222209376.6, filed on Aug. 22, 2022. The disclosures of the aforementioned applications are hereby incorporated by reference in their entireties.

TECHNICAL FIELD

This application relates to the field of solar cell technologies, and in particular, to a back-contact solar cell.

BACKGROUND

A back-contact solar cell is a solar cell in which emitters and metal contacts are arranged on its back surface and no metal electrode is arranged on its front surface. Compared with a solar cell with a metal electrode arranged on its front surface, the back-contact solar cell has a higher short-circuit current and photovoltaic conversion efficiency, and is one of existing technical directions for realizing efficient crystalline silicon solar cells.

However, in existing back-contact solar cells, it is difficult to distinguish between two types of doped semiconductor layers having opposite conductivity types, leading to an increased difficulty in accurately arranging two types of conductive structures having opposite polarities on the two types of doped semiconductor layers. That is, the back-contact solar cells are easily short-circuited, affecting the electrical stability of the back-contact solar cells.

SUMMARY

An objective of this application is to provide a back-contact solar cell, to improve the distinguishability between a first doped semiconductor layer and a second doped semiconductor layer, reduce the difficulty in accurately arranging conductive structures having the same polarities as the two types of doped semiconductor layers on the two types of doped semiconductor layers, and avoid short circuit of the back-contact solar cell, thereby improving the electrical stability of the back-contact solar cell.

This application provides a back-contact solar cell. The back-contact solar cell includes: a semiconductor substrate, a first doped semiconductor layer, and a second doped semiconductor layer.

The semiconductor substrate includes a first surface and a second surface opposite to the first surface. The second surface includes a first region and a second region arranged alternately in a direction parallel to the second surface. A surface of the first region has a first convex structure, and a surface of the second region has a second convex structure. A morphology of each convex distributed in the first convex structure is different from a morphology of each convex distributed in the second convex structure. The first doped semiconductor layer is formed in or on the first region. The second doped semiconductor layer is formed in or on the second region. A conductivity type of the second doped semiconductor layer is opposite to a conductivity type of the first doped semiconductor layer.

In a case that the foregoing technical solution is used, the surface of the first region on the second surface has the first convex structure; and the surface of the second region on the second surface has the second convex structure. In addition, the morphology of each convex distributed in the first convex structure is different from the morphology of each convex distributed in the second convex structure. In this case, when the first doped semiconductor layer is formed in the first region and the second doped semiconductor layer is formed in the second region, through a difference between a morphology of the first convex structure and a morphology of the second convex structure, specific formation positions of the first doped semiconductor layer and the second doped semiconductor layer in the semiconductor substrate can be well distinguished from each other.

When the first doped semiconductor layer is formed on the first region and the second doped semiconductor layer is formed on the second region, in a direction parallel to the surface of the first region, heights of portions of the first doped semiconductor layer are substantially the same, so that a morphology of the first doped semiconductor layer facing away from the semiconductor substrate is substantially the same as the morphology of the first region; and similarly, in a direction parallel to the surface of the second region, heights of portions of the second doped semiconductor layer are substantially the same, so that a morphology of the second doped semiconductor layer facing away from the semiconductor substrate is substantially the same as the morphology of the second region. Based on this, as described above, in a case that the morphology of the first region is different from the morphology of the second region, the morphology of the side of the first doped semiconductor layer facing away from the semiconductor substrate is also different from the morphology of the side of the second doped semiconductor layer facing away from the semiconductor substrate, so that specific formation positions of the first doped semiconductor layer and the second doped semiconductor layer on the semiconductor substrate can be well distinguished from each other through the difference.

Similarly, when the first doped semiconductor layer is formed in the first region and the second doped semiconductor layer is formed on the second region, specific formation positions of doped semiconductor layers having different conductivity types may be distinguished from each other through the morphology of the first region and the morphology of the side of the second doped semiconductor layer facing away from the semiconductor substrate. When the first doped semiconductor layer is formed on the first region and the second doped semiconductor layer is formed in the second region, the specific formation positions of the doped semiconductor layers having different conductivity types may be distinguished from each other through the morphology of the side of the first doped semiconductor layer facing away from the semiconductor substrate and the morphology of the second region.

Based on the above, compared with existing back-contact solar cells including two types of doped semiconductor layers having opposite conductivity types and a same morphology, in the back-contact solar cell provided in this application, there is higher distinguishability between the first doped semiconductor layer and the second doped semiconductor layer, so that the difficulty in accurately arranging the conductive structures having the same polarities as the two types of doped semiconductor layers on the first doped semiconductor layer and the second doped semiconductor layer respectively can be reduced, and a risk of short circuit of the back-contact solar cell caused by coupling of the first doped semiconductor layer and the second doped semiconductor layer having opposite conductivity types through the conductive structures can be further reduced, thereby improving the electrical stability of the back-contact solar cell.

In addition, surfaces of both the first convex structure and the second convex structure are smoother than a surface of a textured structure. Therefore, compared with back-contact solar cells with the textured structure on a back surface, in the back-contact solar cell provided in this application, surfaces of the first doped semiconductor layer and the second doped semiconductor layer are smoother, facilitating deposition of a surface passivation layer on the surfaces of the two doped semiconductor layers. Therefore, the surface passivation layer forms a denser film with an improved passivation effect, thereby effectively improving an open circuit voltage of the back-contact solar cell and improving the photovoltaic conversion efficiency of the back-contact solar cell.

In a possible implementation, the surface of the first region is provided with first grid-shaped grooves recessed toward the semiconductor substrate; and the first convex structure is located in a grid region encircled by the first grid-shaped grooves. In this case, in an actual application process, the first grid-shaped grooves recessed toward the semiconductor substrate may be provided through manners such as laser etching on the formed first region, so that a part of the first region located on inner sides of the first grid-shaped grooves forms the first convex structure. In this case, each convex distributed in the first convex structure is obvious, helping distinguish a specific formation position of the first doped semiconductor layer through the first convex structure.

In a possible implementation, the surface of the second region is provided with second grid-shaped grooves recessed toward the semiconductor substrate; and the second convex structure is located in a grid region encircled by the second grid-shaped grooves. For beneficial effects in this case, reference may be made to the analysis of the beneficial effects of the first grid-shaped grooves above, and details are not described herein again.

In another possible implementation, the first convex structure is a first pyramid base structure obtained through polishing treatment. In this case, the first convex structure may be obtained by performing polishing treatment on a pyramid structure originally formed on the surface of the first region and removing an upper half part of the pyramid structure, to obtain the first pyramid base structure. Compared with the first convex structure located in the grid region encircled by the first grid-shaped grooves, the first pyramid base structure is a microstructure. Therefore, when the first convex structure is the first pyramid base structure obtained through polishing treatment, thinning to a thickness of the semiconductor substrate for forming the first convex structure on the surface of the first region may be reduced, so that a probability that light is absorbed after being incident to the semiconductor substrate is further increased while production of a thin back-contact solar cell is implemented, thereby improving the photovoltaic conversion efficiency of the back-contact solar cell.

In another possible implementation, the second convex structure is a second pyramid base structure obtained through polishing treatment. For beneficial effects in this case, reference may be made to the analysis of the beneficial effects of the first pyramid base structure above, and details are not described herein again.

In a possible implementation, a surface of each convex distributed in the first convex structure facing away from the semiconductor substrate is in a shape of a first quasi-polygon; a surface of each convex distributed in the second convex structure facing away from the semiconductor substrate is in a shape of a second quasi-polygon; and a side length of the first quasi-polygon is different from a side length of the second quasi-polygon. In this case, a size of the first quasi-polygon is different from a size of the second quasi-polygon. In this case, the specific formation positions of the first doped semiconductor layer and the second doped semiconductor layer may be distinguished from each other more intuitively through at least a size difference obtained by comparing quasi-polygons corresponding to the convexes on the surface of the first doped semiconductor layer and the surface of the second doped semiconductor layer.

In a possible implementation, a height of each convex distributed in the first convex structure is different from a height of each convex distributed in the second convex structure. In this case, the specific formation positions of the first doped semiconductor layer and the second doped semiconductor layer may be distinguished from each other through at least a difference obtained by comparing the heights corresponding to the convexes on the surface of the first doped semiconductor layer and the surface of the second doped semiconductor layer. Therefore, a possible solution for distinguishing between the first doped semiconductor layer and the second doped semiconductor layer is provided, and the applicability of the back-contact solar cell provided in this application in different application scenarios is improved.

In a possible implementation, the side length of the first quasi-polygon is less than the side length of the second quasi-polygon. In addition, the height of each convex distributed in the first convex structure is greater than the height of each convex distributed in the second convex structure. In this case, when distinguishing is performed by comparing sizes of quasi-polygons corresponding to the convexes included on the regions on a back surface of the back-contact solar cell, a region corresponding to a smaller quasi-polygon is the formation position of the first doped semiconductor layer; and a region corresponding to a larger quasi-polygon is the formation position of the second doped semiconductor layer. In addition, the surface of the second region having the second convex structure is smoother than the surface of the first region having the first convex structure, so that a passivation effect of the surface passivation layer to a surface of the second doped semiconductor layer can be enhanced, thereby further improving the photovoltaic conversion efficiency of the back-contact solar cell. Furthermore, when distinguishing is performed by comparing a difference between heights corresponding to the convexes included on the surfaces of the regions on the back surface of the back-contact solar cell, a region corresponding to a greater convex height is the formation position of the first doped semiconductor layer; and a region corresponding to a smaller convex height is the formation position of the second doped semiconductor layer, so that the first doped semiconductor layer and the second doped semiconductor layer can be distinguished from each other easily. In addition, when the first convex structure and the second convex structure are respectively the first pyramid base structure and the second pyramid base structure obtained through polishing treatment, because a height is inversely proportional to a side length of each of the first pyramid base structure and the second pyramid base structure, when the height of each convex distributed in the first convex structure is greater than the height of each convex distributed in the second convex structure, the side length of the first quasi-polygon is less than the side length of the second quasi-polygon. Based on this, for beneficial effects in this case, reference may be made to the beneficial effects when the side length of the first quasi-polygon is less than the side length of the second quasi-polygon described above, and details are not described herein again.

In an example, in a case that the side length of the first quasi-polygon is less than the side length of the second quasi-polygon, a doping concentration of the first doped semiconductor layer is less than a doping concentration of the second doped semiconductor layer.

In a case that the foregoing technical solution is used, within a specific range, contact resistance between a doped semiconductor layer and a conductive structure is inversely proportional to a doping concentration of the doped semiconductor layer. In addition, because the side length of the second quasi-polygon is greater than the side length of the first quasi-polygon, the surface of the second region having the second convex structure is smoother than the surface of the first region having the first convex structure, so that the surface of the second doped semiconductor layer is smoother than the surface of the first doped semiconductor layer. A smooth surface corresponds to a small specific surface area. Therefore, after a passivation material for manufacturing the surface passivation layer is deposited, a thickness of the passivation material on the second doped semiconductor layer is greater than a thickness of the passivation material on the first doped semiconductor layer. In other words, a thickness of the surface passivation layer on the second doped semiconductor layer with a greater doping concentration is greater than a thickness of the surface passivation layer on the first doped semiconductor layer with a smaller doping concentration. Based on this, when elements in an electrode are subsequently diffused as doping elements into the first doped semiconductor layer by sintering the electrode to increase the doping concentration of the first doped semiconductor layer and reduce contact resistance between the first doped semiconductor layer and a corresponding conductive structure, the thickness of the surface passivation layer on the second doped semiconductor layer is large, so that a problem that a part of the surface passivation layer on the second doped semiconductor layer is prematurely burnt through due to a long sintering time or a high sintering temperature can be resolved, thereby ensuring good contact of the first doped semiconductor layer and the second doped semiconductor layer and improving the electrical performance of the back-contact solar cell.

In an example, the first convex structure and the second convex structure each include a top surface and a bottom surface opposite to the top surface; a surface of each of the first convex structure and the second convex structure facing away from the semiconductor substrate is defined as the top surface; and in a case that the side length of the first quasi-polygon is less than the side length of the second quasi-polygon, the top surface of the second convex structure is recessed toward the semiconductor substrate relative to the top surface of the first convex structure.

In a case that the foregoing technical solution is used, the top surface of the second convex structure is recessed toward the semiconductor substrate relative to the top surface of the first convex structure, so that a surface of the second doped semiconductor layer facing away from the semiconductor substrate is also recessed inward toward the semiconductor substrate relative to a surface of the first doped semiconductor layer facing away from the semiconductor substrate. Based on this, even when the side length of the first quasi-polygon is less than the side length of the second quasi-polygon, leading to that the thickness of the surface passivation layer on the second doped semiconductor layer is greater than the thickness of the surface passivation layer on the first doped semiconductor layer, a height difference between surfaces of parts of the surface passivation layer on the first region and the second region can also be eliminated by recessing the surface of the second doped semiconductor layer facing away from the semiconductor substrate inward toward the semiconductor substrate relative to the surface of the first doped semiconductor layer facing away from the semiconductor substrate. In the foregoing case, when electrode windows are provided on the parts of the surface passivation layer on the two regions through laser etching, gaps between a laser lens and the parts of the surface passivation layer on the two regions are the same, so that etching can be performed on the parts of the surface passivation layer on the two regions under the same depth of focus. Therefore, a problem in the related art that one type of electrode windows cannot be opened and the other type of electrode windows are over-etched since depths of focus of the two parts cannot be met simultaneously during laser etching due to the height difference between the surfaces of the parts of the surface passivation layer on the two regions can be resolved, and it is ensured that a first electrode and a second electrode subsequently formed may respectively run through the surface passivation layer through corresponding types of electrode windows, thereby reducing contact resistance at the first electrode and the second electrode. In addition, the first electrode and the second electrode subsequently formed do not extend into doped semiconductor layers having corresponding conductivity types, thereby ensuring that carrier recombination rates at both the first electrode and the second electrode are low and improving the photovoltaic conversion efficiency of the back-contact solar cell.

In a possible implementation, the side length of the first quasi-polygon ranges from 0.5 μm to 20 μm; and the height of each convex distributed in the first convex structure ranges from 0.5 μm to 5 μm. In this case, in an actual manufacturing process, when treatment such as polishing is at least performed on the surface of the first region to form the first convex structure, the side length of the first quasi-polygon has a specific optional range, so that there is no need to impose a strict requirement on treatment conditions such as a polishing time to process a side length of each convex on the surface of the first region to a fixed value, thereby reducing the difficulty of the treatment such as polishing. In addition, compared with a convex with a nano-sized side length, the first quasi-polygon has a micron-sized side length, so that the morphology of the first region is more obvious, and the specific formation positions of the first doped semiconductor layer and the second doped semiconductor layer can be distinguished from each other more easily. For beneficial effects of setting the height of each convex distributed in the first convex structure to 0.5 μm to 5 μm, reference may be made to the beneficial effects when the side length of the first quasi-polygon ranges from 0.5 μm to 20 μm described above, and details are not described herein again.

In a possible implementation, the side length of the second quasi-polygon ranges from 10 μm to 50 μm; and the height of each convex distributed in the second convex structure ranges from 0.5 μm to 10 μm. For beneficial effects in this case, reference may be made to the beneficial effects when the side length of the first quasi-polygon ranges from 0.5 μm to 20 μm described above. In addition, when the second doped semiconductor layer is formed on the second convex structure, a thickness of the second doped semiconductor layer generally ranges from 20 nm to 600 nm. The side length of each convex on the second region ranges from 10 μm to 50 μm, and the side length is far greater than the thickness of the second doped semiconductor layer. Based on this, no matter whether the second doped semiconductor layer is formed in or on the second region, the surface of the second doped semiconductor layer facing away from the semiconductor substrate has an obvious convex morphology, helping improve the distinguishability of the formation position of the second doped semiconductor layer. For beneficial effects of setting the height of each convex distributed in the second convex structure to 0.5 μm to 10 μm, reference may be made to the beneficial effects when the side length of the second quasi-polygon ranges from 10 μm to 50 μm described above, and details are not described herein again.

In a possible implementation, each convex distributed in the first convex structure and each convex distributed in the second convex structure both include a top surface and a bottom surface opposite to the top surface; a surface of each convex distributed in the first convex structure and each convex distributed in the second convex structure facing away from the semiconductor substrate is defined as the top surface; an area of the top surface of each convex distributed in the first convex structure is smaller than an area of the bottom surface of the convex; and an area of the top surface of each convex distributed in the second convex structure is smaller than an area of the bottom surface of the convex.

In a case that the foregoing technical solution is used, when the area of the top surface of each convex distributed in the first convex structure is smaller than the area of the bottom surface of the convex, a gap between tops of adjacent convexes distributed in the first convex structure is greater than a gap between bottoms of the convexes. In this way, an etching agent used for etching to form the first convex structure and reaction impurities are completely discharged from the adjacent convexes after the first convex structure is formed on the surface of the first region, so that problems such as current leakage caused by the etching agent and the reaction impurities remaining between the adjacent convexes are prevented, thereby improving the electrical performance of the back-contact solar cell. In addition, for beneficial effects of setting the area of the top surface of each convex distributed in the second convex structure to be less than the area of the bottom surface of the convex, reference may be made to the analysis of the beneficial effects when the area of the top surface of each convex distributed in the first convex structure is smaller than the area of the bottom surface of the convex, and details are not described herein again.

In a possible implementation, both the top surface and the bottom surface of each convex distributed in the first convex structure are in a shape of a quasi-polygon; and both the top surface and the bottom surface of each convex distributed in the second convex structure are in a shape of a quasi-polygon. In this case, each convex distributed in the first convex structure and each convex distributed in the second convex structure both have a regular quasi-prism morphology. Compared with a first region and a second region having convexes with an irregular morphology, surfaces of the first region and the second region having convexes with the regular quasi-prism morphology are flatter, helping improve the compactness of the parts of the surface passivation layer formed on the first region and the second region, thereby improving a passivation effect of the surface passivation layer to the two regions and further improving the photovoltaic conversion efficiency of the back-contact solar cell.

In a possible implementation, when the first doped semiconductor layer is formed on the first region, the back-contact solar cell further includes a first tunneling passivation layer located between the first convex structure and the first doped semiconductor layer.

In a case that the foregoing technical solution is used, the first tunneling passivation layer may form a tunneling passivation contact structure with the first doped semiconductor layer. In the tunneling passivation contact structure, the first tunneling passivation layer allows most carriers to tunnel into the first doped semiconductor layer and blocks a few carriers from passing through, and the most carriers are transmitted by the second doped semiconductor layer and collected by a corresponding conductive structure. Therefore, recombination rates of carriers having different conductivity types on the surface of the first region are reduced, and excellent interface passivation and selective collection of carriers are implemented, thereby further improving the photovoltaic conversion efficiency of the back-contact solar cell.

In a possible implementation, when the second doped semiconductor layer is formed on the second region, the back-contact solar cell further includes a second tunneling passivation layer located between the second convex structure and the second doped semiconductor layer. For beneficial effects in this case, reference may be made to the beneficial effects of arrangement of the first tunneling passivation layer described above, and details are not described herein again.

In a possible implementation, the second surface further includes an isolation region between each first region and each second region neighboring to the first region.

In a case that the foregoing technical solution is used, a conductivity type of the first doped semiconductor layer formed in or on the first region is opposite to a conductivity type of the second doped semiconductor layer formed in or on the second region. Therefore, in a case that the second surface further includes an isolation region between each first region and each second region neighboring to the first region, the isolation region can separate the first doped semiconductor layer and the second doped semiconductor layer adjacent to each other, so that recombination of the carriers having different conductivity types at a lateral junction of the first doped semiconductor layer and the second doped semiconductor layer is suppressed, thereby preventing current leakage at the lateral junction of the two doped semiconductor layers and further improving the photovoltaic conversion efficiency of the back-contact solar cell.

In a possible implementation, a surface of the isolation region has a regular pyramid textured structure, a third pyramid base structure, or an inverted pyramid textured structure.

In a case that the foregoing technical solution is used, when the surface of the isolation region has the third pyramid base structure, the surface of the isolation region is a flat polished surface. In this case, the polished surface has a relatively good reflection characteristic, so that light can be at least partially reflected back into the semiconductor substrate after reaching an inner surface of the isolation region and be reused by the semiconductor substrate, thereby improving the utilization of light energy by the back-contact solar cell. When the surface of the isolation region has the inverted pyramid structure, a hole of the inverted pyramid structure extends into the semiconductor substrate. In this case, the first doped semiconductor layer and the second doped semiconductor layer may be isolated through a physical isolating material such as air or a passivation material inside the inverted pyramid structure, thereby further reducing recombination rates of carriers having opposite conductivity types at the lateral junction of the first doped semiconductor layer and the second doped semiconductor layer, and improving the photovoltaic conversion efficiency of the back-contact solar cell. When the surface of the isolation region has the regular pyramid textured structure, because the regular pyramid textured structure has a light trapping characteristic, more light can be refracted from an outer surface of the isolation region into the semiconductor substrate, thereby improving the photovoltaic conversion efficiency of the back-contact solar cell.

In a possible implementation, the back-contact solar cell further includes a surface passivation layer covering the first doped semiconductor layer and the second doped semiconductor layer. In this case, the surface passivation layer can passivate a side of the back-contact solar cell located on the second surface, thereby reducing a carrier recombination rate on the second surface and improving the photovoltaic conversion efficiency of the back-contact solar cell.

In a possible implementation, the back-contact solar cell further includes a first electrode formed on the first doped semiconductor layer.

In a possible implementation, the back-contact solar cell further includes a second electrode formed on the second doped semiconductor layer.

The foregoing description is merely an overview of the technical solutions of this application. To understand the technical solutions of this application more clearly, implementation can be performed according to the content of the specification. Moreover, to make the foregoing and other objectives, features, and advantages of this application more comprehensible, specific implementations of this application are described below.

BRIEF DESCRIPTION OF THE DRAWINGS

To describe the technical solutions in the embodiments of this application or in the related art more clearly, the following briefly describes the accompanying drawings required for describing the embodiments or the related art. Apparently, the accompanying drawings in the following description show merely some embodiments of this application, and a person of ordinary skill in the art may further derive other accompanying drawings according to the accompanying drawings without creative efforts.

The accompanying drawings described herein are used to provide a further understanding of this application, and form a part of this application. Exemplary embodiments of this application and description thereof are used to explain this application, and do not constitute any inappropriate limitation to this application. In the accompanying drawings.

DESCRIPTION OF REFERENCE NUMERALS

Figure 1:
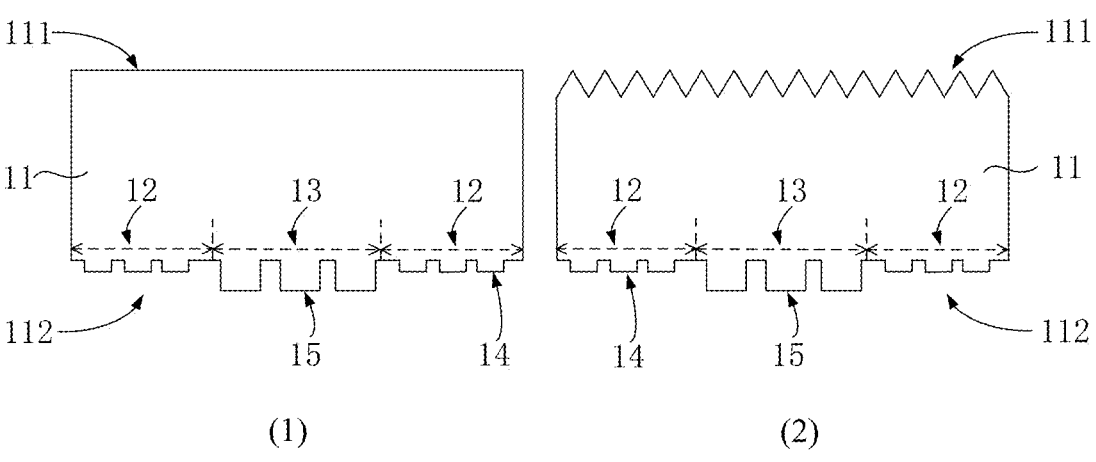
FIG. 1(1) and FIG. 1(2) are schematic longitudinal cross-sectional views of a first structure and a second structure of a semiconductor substrate according to an embodiment of this application.

11—semiconductor substrate, 111—first surface, 112—second surface, 12—first region, 13—second region, 14—first convex structure, 141—first convex, 142—first concave, 15—second convex structure, 151—second convex, 152—second concave, 16—first doped semiconductor layer, 17—second doped semiconductor layer, 18—isolation region, 19—first tunneling passivation layer, 20—second tunneling passivation layer, 21—regular pyramid textured structure, 22—third pyramid base structure, 23—inverted pyramid structure, 24—surface passivation layer, 25—first electrode, and 26—second electrode.

DETAILED DESCRIPTION

To make the objectives, technical solutions, and advantages of the embodiments of this application clearer, the following clearly and completely describes the technical solutions in the embodiments of this application with reference to the accompanying drawings in the embodiments of this application. Apparently, the described embodiments are merely some embodiments of this application rather than all of the embodiments. All other embodiments obtained by a person of ordinary skill in the art based on the embodiments of this application without making creative efforts shall fall within the protection scope of this application.

It should be noted that, when an element is described as being "fixed on" or "disposed on" another element, the element may be directly located on the another element or indirectly located on the another element. When an element is described as being "connected to" another element, the element may be directly connected to the another element or indirectly connected to the another element.

In addition, the terms "first" and "second" are used merely for the purpose of description, and shall not be construed as indicating or implying relative importance or implying a quantity of indicated technical features. Therefore, a feature defined by "first" or "second" may explicitly indicate or implicitly include one or more features. In the description of this application, "a plurality of" means two or more, unless otherwise definitely and specifically limited. "Several" means one or more, unless otherwise definitely and specifically limited.

In the description of this application, it should be understood that orientation or position relationships indicated by the terms such as "on", "below", "front", "rear", "left", "right", and the like are based on orientation or position relationships shown in the accompanying drawings, and are used only for ease and brevity of illustration of this application and description, rather than indicating or implying that the mentioned apparatus or element must have a particular orientation or must be constructed and operated in a particular orientation. Therefore, such terms should not be construed as a limitation to this application.

In the description of this application, it should be noted that, unless otherwise explicitly specified or defined, the terms such as "mount", "connect", and "connection" should be understood in a broad sense. For example, the connection may be a fixed connection, a detachable connection, or an integral connection; or the connection may be a mechanical connection or an electrical connection; or the connection may be a direct connection, an indirect connection through an intermediary, internal communication between two elements, or an interactive relationship between two elements. A person of ordinary skill in the art can understand specific meanings of the terms in this application based on specific situations.

At present, solar cells are increasingly widely used as a new energy alternative solution. A photovoltaic solar cell is an apparatus converting sun's light energy into electric energy. Specifically, the solar cell generates carriers by using the photovoltaic principle, and leads the carriers out by using electrodes, thereby facilitating the effective use of the electric energy.

When a positive electrode and a negative electrode included in the solar cell are both located on a back surface of the solar cell, the solar cell is a back-contact solar cell. Existing back-contact solar cells include a metal wrap through (MWT) solar cell, an interdigitated back-contact (IBC) solar cell, and the like. A main characteristic of the IBC solar cell is that emitters and metal contacts are all located on a back surface of the solar cell, and a front surface is not blocked by metal electrodes, so that the IBC solar cell has a higher short-circuit current Isc. In addition, the back surface of the IBC solar cell may allow a wider metal grid wire to reduce series resistance Rs, so that a fill factor FF can be improved. In addition, this solar cell without blocking on the front surface is more beautiful in addition to having high photovoltaic conversion efficiency. Besides, it is easier to assemble an all-back electrode module, so that the IBC solar cell is one of existing technical directions for realizing high efficient crystalline silicon solar cells.

Specifically, the IBC solar cell generally includes a semiconductor substrate, a first doped semiconductor layer, and a second doped semiconductor layer. Along a direction parallel to a surface of the semiconductor substrate, the first doped semiconductor layer and the second doped semiconductor layer are alternately formed on the same side of the semiconductor substrate. In addition, a conductivity type of the second doped semiconductor layer is opposite to a conductivity type of the first doped semiconductor layer. In semiconductor substrates included in the existing back-contact solar cells, sizes and shapes of convexes distributed in convex structures on surfaces of two regions corresponding to the first doped semiconductor layer and the second doped semiconductor layer are the same. In this case, the first doped semiconductor layer and the second doped semiconductor layer respectively formed in or on the two regions have the same morphology, leading to the difficulty in distinguishing between the first doped semiconductor layer and the second doped semiconductor layer. In this case, when conductive structures configured to lead out the carriers are respectively arranged on the first doped semiconductor layer and the second doped semiconductor layer having opposite conductivity types, the difficulty in accurately arranging two types of conductive structures having opposite polarities on the two types of doped semiconductor layers is increased. That is, the back-contact solar cells are easily short-circuited, affecting the electrical stability of the back-contact solar cells.

As shown in FIG. 6 to FIG. 13, the embodiments of this application provide a back-contact solar cell. The back-contact solar cell includes: a semiconductor substrate 11, a first doped semiconductor layer 16, and a second doped semiconductor layer 17.

Figure 2:
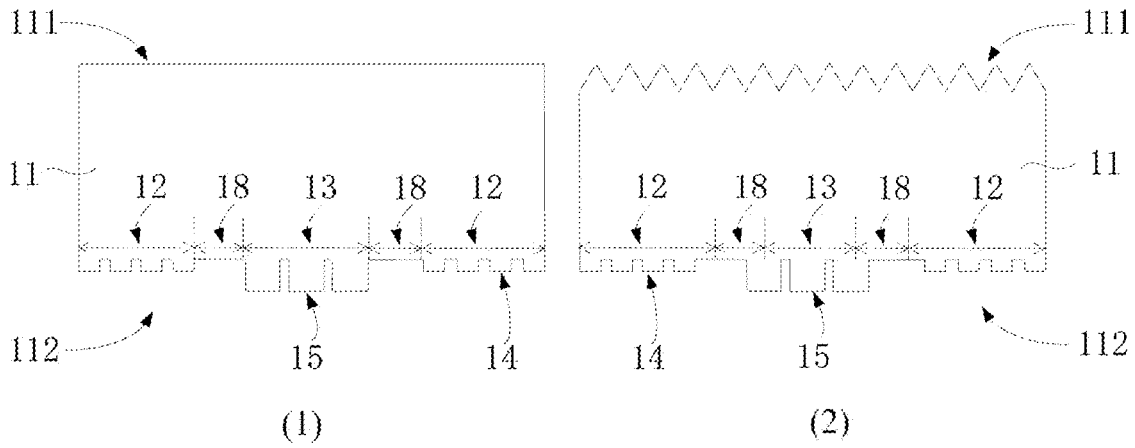
FIG. 2(1) and FIG. 2(2) are schematic longitudinal cross-sectional views of a third structure and a fourth structure of a semiconductor substrate according to an embodiment of this application.

As shown in parts (1) and (2) in FIG. 1 and FIG. 2, the semiconductor substrate 11 has a first surface 111 and a second surface 112 opposite to the first surface. The second surface 112 includes a first region 12 and a second region 13 arranged alternately in a direction parallel to the second surface 112. A surface of the first region 12 has a first convex structure 14, and a surface of the second region 13 has a second convex structure 15. A morphology of each convex distributed in the first convex structure 14 is different from a morphology of each convex distributed in the second convex structure 15. As shown in FIG. 6 to FIG. 9, the first doped semiconductor layer 16 is formed in or on the first region 12; and the second doped semiconductor layer 17 is formed in or on the second region 13. A conductivity type of the second doped semiconductor layer 17 is opposite to a conductivity type of the first doped semiconductor layer 16.

Specifically, in terms of materials, the semiconductor substrate may be a substrate made of a semiconductor material such as a silicon substrate, a silicon germanium substrate, or a germanium substrate. In terms of conductivity types, the semiconductor substrate may be an N-type semiconductor substrate or a P-type semiconductor substrate. In addition, the first surface of the semiconductor substrate corresponds to a light receiving surface of the back-contact solar cell; and the second surface of the semiconductor substrate corresponds to a back surface of the back-contact solar cell. Based on this, in terms of structures, as shown by the parts (1) in FIG. 1 and FIG. 2, the first surface 111 of the semiconductor substrate 11 may be a polished surface, that is, a flat surface. Alternatively, as shown by the parts (2) in FIG. 1 and FIG. 2, the first surface 111 of the semiconductor substrate 11 may alternatively be a textured structure with a morphology such as a regular pyramid. In this case, the textured structure has a light trapping function, so that when the first surface 111 of the semiconductor substrate 11 has the textured structure, more light can be refracted into the semiconductor substrate 11, thereby improving the photovoltaic conversion efficiency of the back-contact solar cell.

In addition, as shown by the parts (1) and (2) in FIG. 1, the semiconductor substrate 11 may only include the first region 12 and the second region 13 arranged alternately. It should be understood that, a boundary between the first region 12 and the second region 13 is a virtual boundary. In addition, because the first doped semiconductor layer is formed in or on the first region 12, a position, quantity, and size of the first region 12 on the semiconductor substrate 11 affect a position, quantity, and size of the subsequently formed first doped semiconductor layer. Correspondingly, because the second doped semiconductor layer is formed in or on the second region 13, a position, quantity, and size of the second region 13 on the semiconductor substrate 11 affect a position, quantity, and size of the subsequently formed second doped semiconductor layer. Based on this, specific positions, quantities, and sizes of the first region 12 and the second region 13 on the semiconductor substrate 11 may be set according to a requirement on information such as positions of the first doped semiconductor layer and the second doped semiconductor layer in an actual application scenario, and are not specifically limited herein.

Specific morphologies of the convexes distributed in the first convex structure on the surface of the first region and the second convex structure on the surface of the second region may be set according to an actual requirement. Specifically, that a morphology of each convex distributed in the first convex structure is different from a morphology of each convex distributed in the second convex structure may refer to that: a shape of a surface of each convex distributed in the first convex structure facing away from the semiconductor substrate is different from a shape of a surface of each convex distributed in the second convex structure facing away from the semiconductor substrate; and/or a size of each convex distributed in the first convex structure is different from a size of each convex distributed in the second convex structure.

The shape of the surface of each of the convexes distributed in the first convex structure and the second convex structure facing away from the semiconductor substrate may be a polygon such as a square, a rectangle, a trapezoid, or a rhombus. In some implementations, the shape of the surface of one or more of the convexes distributed in the first convex structure and the second convex structure facing away from the semiconductor substrate may be a combination of polygons, for example, a combination of two or more squares, two or more rectangles, two or more trapezoids, or two or more rhombuses. A specific shape of the surface of each of the convexes distributed in the first convex structure and the second convex structure facing away from the semiconductor substrate may be set according to an actual requirement, and is not specifically limited herein.

That a size of each convex distributed in the first convex structure is different from a size of each convex distributed in the second convex structure may refer to that: a size of the surface of each convex distributed in the first convex structure facing away from the semiconductor substrate is different from a size of the surface of each convex distributed in the second convex structure facing away from the semiconductor substrate. For example, an example in which the shape of the surface of each convex distributed in the first convex structure facing away from the semiconductor substrate is a first quasi-polygon and the shape of the surface of each convex distributed in the second convex structure facing away from the semiconductor substrate is a second quasi-polygon is used. In this case, a side length of the first quasi-polygon is different from a side length of the second quasi-polygon. In this case, a size of a quasi-polygon corresponding to a side of each convex distributed in the first convex structure facing away from the semiconductor substrate is different from a size of a quasi-polygon corresponding to a side of each convex distributed in the second convex structure facing away from the semiconductor substrate. Based on this, the specific formation positions of the first doped semiconductor layer and the second doped semiconductor layer may be distinguished from each other more intuitively through at least a size difference obtained by comparing quasi-polygons corresponding to the convexes on the surface of the first doped semiconductor layer and the surface of the second doped semiconductor layer. It should be noted that, the shape of the surface of each of the convexes distributed in the first convex structure and the second convex structure facing away from the semiconductor substrate may alternatively be a non-quasi-polygon such as a circle, provided that the morphology of each convex distributed in the first convex structure is different from the morphology of each convex distributed in the second convex structure.

Alternatively, a height of each convex distributed in the first convex structure is different from a height of each convex distributed in the second convex structure. In this case, the specific formation positions of the first doped semiconductor layer and the second doped semiconductor layer may be distinguished from each other through at least a difference obtained by comparing the heights corresponding to the convexes on the surface of the first doped semiconductor layer and the surface of the second doped semiconductor layer. Therefore, a possible solution for distinguishing between the first doped semiconductor layer and the second doped semiconductor layer is provided, and the applicability of the back-contact solar cell provided in this application in different application scenarios is improved. For example, due to the difference in heights of the convexes (e.g., on a microscopic level), the first convex structure 14 and the second convex structure 15 can appear in different color shades (e.g., on a macroscopic level). As such, it is easier to differentiate the first region 12 having the first convex structure 14 and the second region 13 having the second convex structure 15 when fabricating the back-contact solar cell. Specifically, the size of each convex distributed in the first convex structure may be greater than the size of each convex distributed in the second convex structure, or the size of each convex distributed in the first convex structure may be less than the size of each convex distributed in the second convex structure, provided that the sizes of the convexes on the two convex structures are different.

In some cases, as shown by the parts (1) and (2) in FIG. 2, the second surface 112 may further include an isolation region 18 between each first region 12 and each second region 13 neighboring to the first region. In this case, a conductivity type of the first doped semiconductor layer formed in or on the first region 12 is opposite to a conductivity type of the second doped semiconductor layer formed in or on the second region 13. Therefore, in a case that the second surface 112 further includes an isolation region 18 between each first region 12 and each second region 13 neighboring to the first region, the isolation region 18 can separate the first doped semiconductor layer and the second doped semiconductor layer adjacent to each other, so that recombination of the carriers having different conductivity types at a lateral junction of the first doped semiconductor layer and the second doped semiconductor layer is suppressed, thereby preventing current leakage at the lateral junction of the two doped semiconductor layers and further improving the photovoltaic conversion efficiency of the back-contact solar cell.

A morphology of the isolation region may be set according to an actual application scenario, provided that the morphology of the isolation region can be applied to the back-contact solar cell provided in the embodiments of this application. For example, a surface of the isolation region may have a regular pyramid textured structure 21, a third pyramid base structure 22, or an inverted pyramid structure 23.

Figure 3:
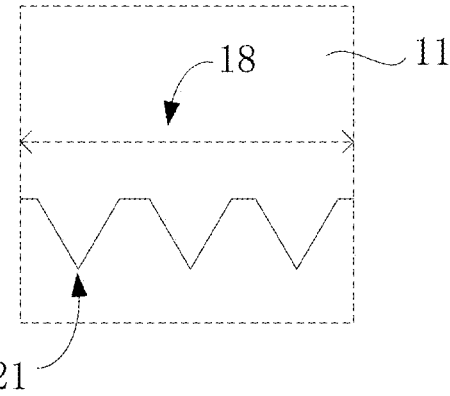
FIG. 3 is a first structural enlarged view at an isolation region of a semiconductor substrate according to an embodiment of this application.
Figure 4:
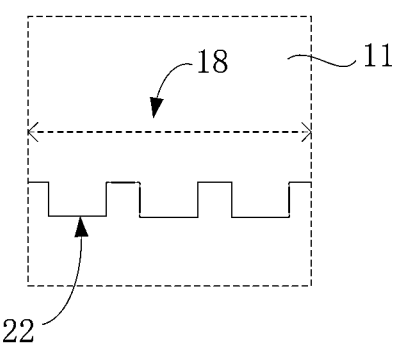
FIG. 4 is a second structural enlarged view at an isolation region of a semiconductor substrate according to an embodiment of this application.
Figure 5:
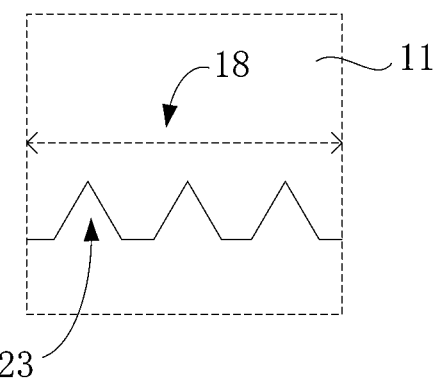
FIG. 5 is a third structural enlarged view at an isolation region of a semiconductor substrate according to an embodiment of this application.

Specifically, as shown in FIG. 4, when the surface of the isolation region 18 has the third pyramid base structure 22, the surface of the isolation region 18 is a flat polished surface. In this case, the polished surface has a relatively good reflection characteristic, so that light can be at least partially reflected back into the semiconductor substrate 11 after reaching an inner surface of the isolation region 18 and be reused by the semiconductor substrate 11, thereby improving the utilization of light energy by the back-contact solar cell. As shown in FIG. 5, when the surface of the isolation region 18 has the inverted pyramid structure 23, a hole of the inverted pyramid structure 23 extends into the semiconductor substrate 11. In this case, the first doped semiconductor layer and the second doped semiconductor layer may be isolated through a physical isolating material such as air or a passivation material inside the inverted pyramid structure 23, thereby further reducing recombination rates of carriers having opposite conductivity types at the lateral junction of the first doped semiconductor layer and the second doped semiconductor layer, and improving the photovoltaic conversion efficiency of the back-contact solar cell. As shown in FIG. 3, when the surface of the isolation region 18 has the regular pyramid textured structure 21, because the regular pyramid textured structure 21 has a light trapping characteristic, more light can be refracted from an outer surface of the isolation region 18 into the semiconductor substrate 11, thereby improving the photovoltaic conversion efficiency of the back-contact solar cell.

When the surface of the isolation region has the third pyramid base structure, a size of each convex distributed in the third pyramid base structure may be the same as or different from the size of each convex distributed in the first convex structure or the second convex structure. Preferably, in a case that a surface of the isolation region facing away from the semiconductor substrate has a height difference with a surface of the first region facing away from the semiconductor substrate and a surface of the second region facing away from the semiconductor substrate respectively, the size of each convex distributed in the third pyramid base structure may be the same as the size of each convex distributed in the first convex structure or the second convex structure. In this case, positions of the three regions may be distinguished from each other through height differences between the surfaces of the three regions. In a case that at least one of the surface of the first region facing away from the semiconductor substrate and the surface of the second region facing away from the semiconductor substrate is flush with the surface of the isolation region facing away from the semiconductor substrate, the size of each convex distributed in the third pyramid base structure is different from the size of each convex distributed in the convex structure corresponding to the region flush with the isolation region, so that the positions of the three regions can be distinguished from each other through the sizes of the convexes.

In addition, the size and the shape of the isolation region affect a gap between the first doped semiconductor layer and the second doped semiconductor layer, so that a width of the isolation region may be set according to a requirement on the gap between the first doped semiconductor layer and the second doped semiconductor layer in an actual application scenario. For example, the width of the isolation region may range from 10 μm to 400 μm.

Figure 6:
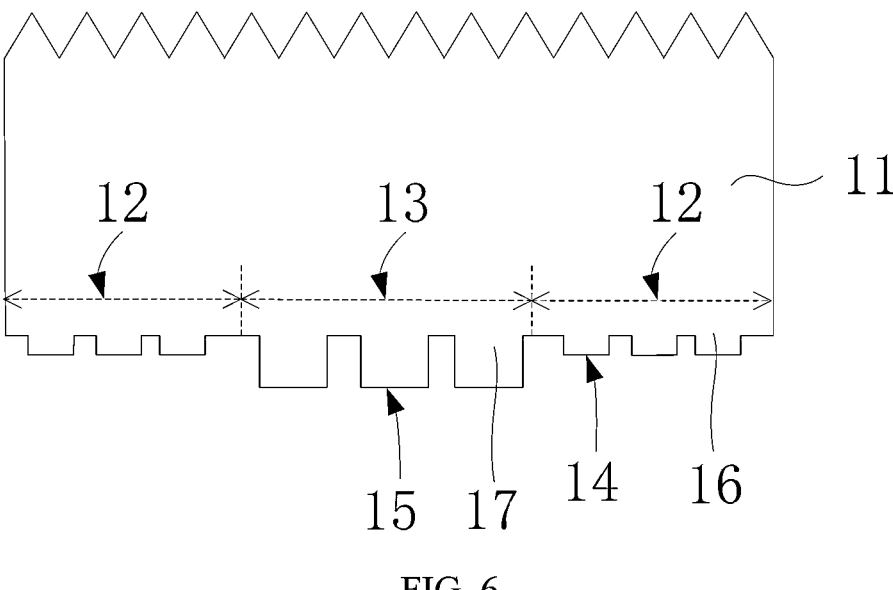
FIG. 6 is a schematic longitudinal cross-sectional view of a first structure of a back-contact solar cell according to an embodiment of this application.

The specific formation positions, conductivity types, and doping concentrations of the first doped semiconductor layer and the second doped semiconductor layer may be set according to an actual requirement, provided that the first doped semiconductor layer and the second doped semiconductor layer can be applied to the back-contact solar cell provided in the embodiments of this application. As shown in FIG. 6, the first doped semiconductor layer 16 may be formed in the first region 12, and the second doped semiconductor layer 17 is formed in the second region 13. In this case, when the semiconductor substrate 11 only includes the first region 12 and the second region 13, at least one of the first doped semiconductor layer 16 and the second doped semiconductor layer 17 may be only partially formed in the corresponding region, to suppress recombination of carriers having opposite conductivity types at a junction of the two doped semiconductor layers. Alternatively, when the semiconductor substrate 11 further includes the isolation region 18, at least one of the first doped semiconductor layer 16 and the second doped semiconductor layer 17 may fill up the corresponding region.

For the conductivity types of the first doped semiconductor layer and the second doped semiconductor layer, the first doped semiconductor layer may be an N-type semiconductor layer doped with N-type conductive particles such as phosphorus. In this case, the second doped semiconductor layer may be a P-type semiconductor layer doped with P-type conductive particles such as boron. Alternatively, the first doped semiconductor layer is a P-type semiconductor layer. In this case, the second doped semiconductor layer is an N-type semiconductor layer.

The doping concentration of the first doped semiconductor layer may be the same as the doping concentration of the second doped semiconductor layer. Alternatively, the doping concentration of the first doped semiconductor layer may be less than the doping concentration of the second doped semiconductor layer. Alternatively, the doping concentration of the first doped semiconductor layer may be greater than the doping concentration of the second doped semiconductor layer.

In addition, when the first doped semiconductor layer is formed on the first region, in terms of internal arrangement of substances, the first doped semiconductor layer may be an amorphous semiconductor layer, a microcrystalline semiconductor layer, a monocrystalline semiconductor layer, a polycrystalline semiconductor layer, a nanocrystalline semiconductor layer, or the like. In terms of materials, a material of the first doped semiconductor layer may include a semiconductor material such as silicon, silicon germanium, germanium, doped silicon carbide, or gallium arsenide. In terms of passivation, the first doped semiconductor layer may be a hydrogenated doped layer. When the semiconductor substrate only includes the first region and the second region, the first doped semiconductor layer laterally intersects with the second doped semiconductor layer, so the first doped semiconductor layer is preferably made of a semiconductor material whose lateral conductivity is zero. Alternatively, the first doped semiconductor layer may be made of a material such as monocrystalline silicon or polycrystalline silicon which has a specific lateral conductivity, and the lateral conductivity of the first doped semiconductor layer can be reduced by setting a thickness of the first doped semiconductor layer to a suitable range, thereby suppressing recombination of carriers at the lateral junction of the first doped semiconductor layer and the second doped semiconductor layer.

For a material of the second doped semiconductor layer, when the second doped semiconductor layer is formed on the second region, reference may be made to the material of the first doped semiconductor layer described above, and details are not described herein again.

In addition, the thickness of the first doped semiconductor layer and a thickness of the second doped semiconductor layer may be set according to an actual application scenario, and are not specifically limited herein.

In a case that the foregoing technical solution is used, as shown in FIG. 6 to FIG. 9, the surface of the first region 12 on the second surface has the first convex structure 14; and the surface of the second region 13 on the second surface has the second convex structure 15. In addition, the morphology of each convex distributed in the first convex structure 14 is different from the morphology of each convex distributed in the second convex structure 15. In this case, as shown in FIG. 6, when the first doped semiconductor layer 16 is formed in the first region 12 and the second doped semiconductor layer 17 is formed in the second region 13, through a difference between a morphology of the first convex structure 14 and a morphology of the second convex structure 15, specific formation positions of the first doped semiconductor layer 16 and the second doped semiconductor layer 17 in the semiconductor substrate 11 can be well distinguished from each other.

Figures 7, 8, 9:
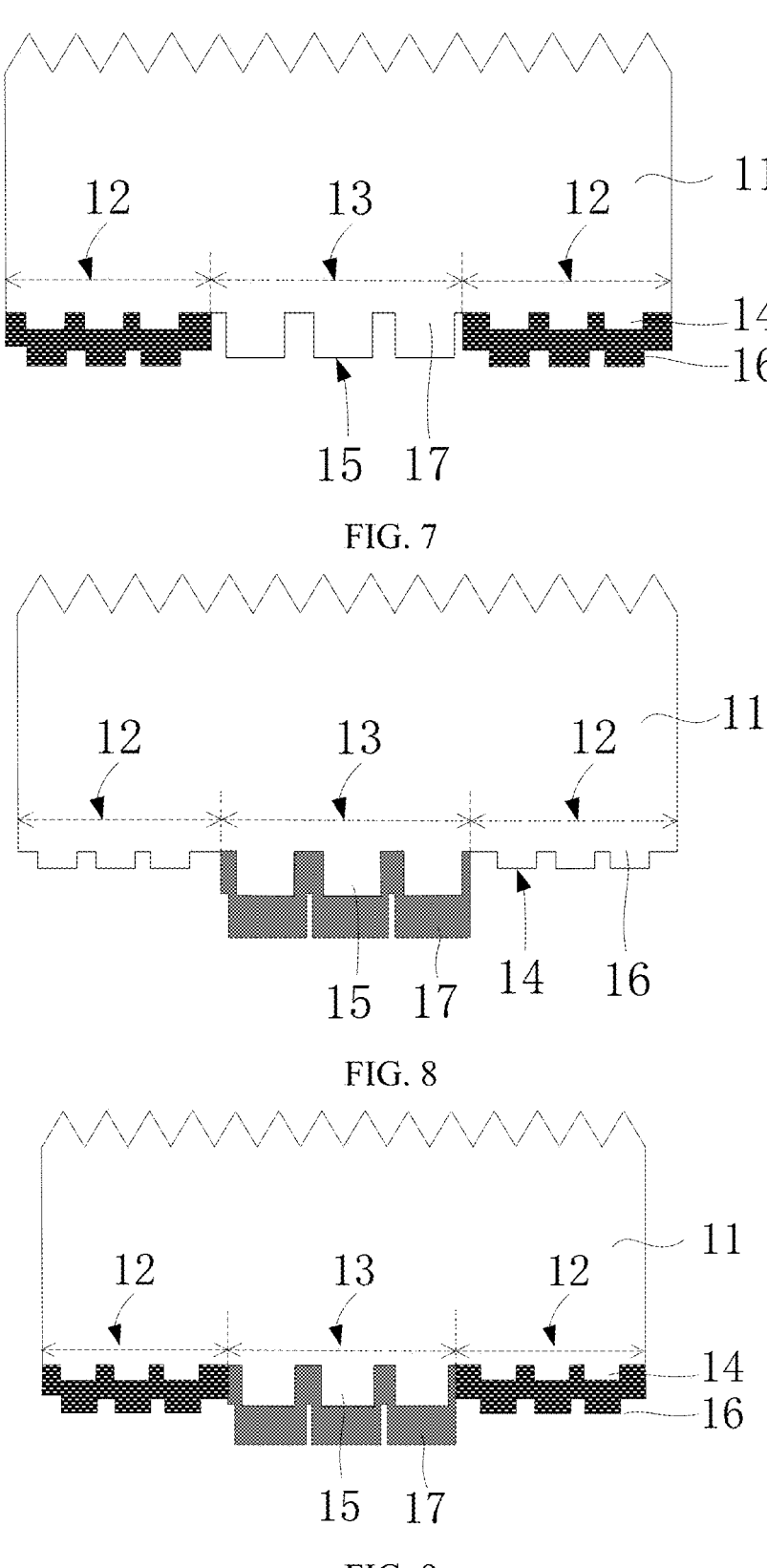
FIG. 7 is a schematic longitudinal cross-sectional view of a second structure of a back-contact solar cell according to an embodiment of this application.
FIG. 8 is a schematic longitudinal cross-sectional view of a third structure of a back-contact solar cell according to an embodiment of this application.
FIG. 9 is a schematic longitudinal cross-sectional view of a fourth structure of a back-contact solar cell according to an embodiment of this application.

As shown in FIG. 7, when the first doped semiconductor layer 16 is formed on the first region 12 and the second doped semiconductor layer 17 is formed on the second region 13, in a direction parallel to the surface of the first region 12, heights of portions of the first doped semiconductor layer 16 are substantially the same, so that a morphology of the first doped semiconductor layer 16 facing away from the semiconductor substrate 11 is substantially the same as a morphology of the first region 12; and similarly, in a direction parallel to the surface of the second region 13, heights of portions of the second doped semiconductor layer 17 are substantially the same, so that a morphology of the second doped semiconductor layer 17 facing away from the semiconductor substrate 11 is substantially the same as a morphology of the second region 13. Based on this, as described above, in a case that the morphology of the first region 12 is different from the morphology of the second region 13, the morphology of the side of the first doped semiconductor layer 16 facing away from the semiconductor substrate 11 is also different from the morphology of the side of the second doped semiconductor layer 17 facing away from the semiconductor substrate 11, so that specific formation positions of the first doped semiconductor layer 16 and the second doped semiconductor layer 17 on the semiconductor substrate 11 can be well distinguished from each other through the difference.

Similarly, as shown in FIG. 8, when the first doped semiconductor layer 16 is formed in the first region 12 and the second doped semiconductor layer 17 is formed on the second region 13, specific formation positions of doped semiconductor layers having different conductivity types may be distinguished from each other through the morphology of the first region 12 and the morphology of the side of the second doped semiconductor layer 17 facing away from the semiconductor substrate 11. As shown in FIG. 9, when the first doped semiconductor layer 16 is formed on the first region 12 and the second doped semiconductor layer 17 is formed in the second region 13, the specific formation positions of the doped semiconductor layers having different conductivity types may be distinguished from each other through the morphology of the side of the first doped semiconductor layer 16 facing away from the semiconductor substrate 11 and the morphology of the second region 13.

Figure 12:
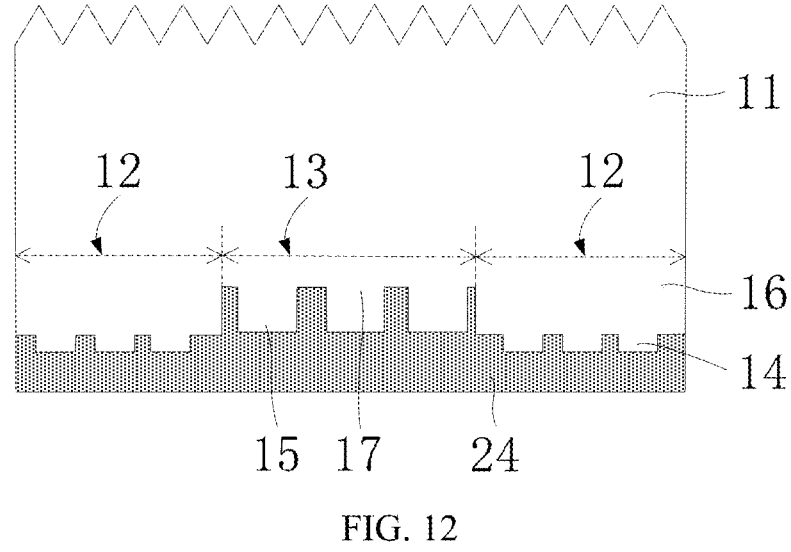
FIG. 12 is a schematic longitudinal cross-sectional view of a seventh structure of a back-contact solar cell according to an embodiment of this application.
Figure 13:
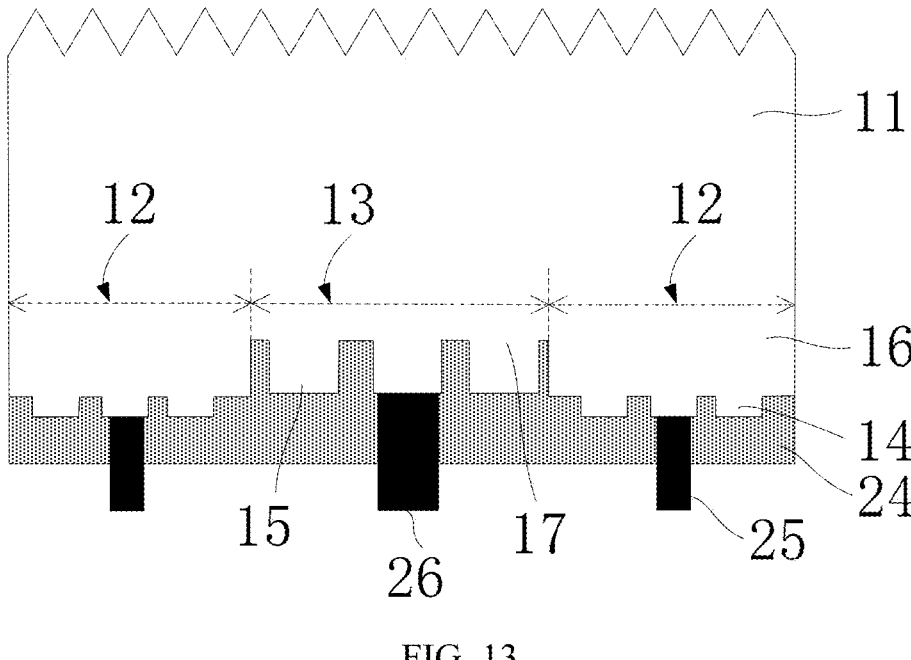
FIG. 13 is a schematic longitudinal cross-sectional view of an eighth structure of a back-contact solar cell according to an embodiment of this application.

In some cases, as shown in FIG. 12 and FIG. 13, the back-contact solar cell may further include a surface passivation layer 24 covering the first doped semiconductor layer 16 and the second doped semiconductor layer 17. In this case, the surface passivation layer 24 can passivate a side of the back-contact solar cell located on the second surface, thereby reducing a carrier recombination rate on the second surface and improving the photovoltaic conversion efficiency of the back-contact solar cell. Specifically, a material and a thickness of the surface passivation layer may be set according to an actual requirement, and are not specifically limited herein. For example, the material of the surface passivation layer may be one or more of silicon nitride, silicon oxide, silicon oxynitride, aluminum oxide, silicon carbide, or amorphous silicon.

In some cases, as shown in FIG. 13, the back-contact solar cell may further include a first electrode 25 formed on the first doped semiconductor layer 16, to lead out carriers collected by the first doped semiconductor layer 16 through the first electrode 25. Specifically, a material of the first electrode may be a conductive material such as silver, aluminum, gallium, stibium, copper, or nickel. A specific material of the first electrode 25 may be determined according to the conductivity type of the first doped semiconductor layer 16. For example, when the first doped semiconductor layer 16 is a P-type doped semiconductor layer, the material of the first electrode 25 may be aluminum or gallium. In another example, when the first doped semiconductor layer 16 is an N-type doped semiconductor layer, the material of the first electrode 25 may be stibium. In this case, during manufacturing of the first electrode 25, material elements in the first electrode 25 may be diffused as doping elements into the first doped semiconductor layer 16 through sintering, to increase the doping concentration of the first doped semiconductor layer 16, reduce contact resistance between the first doped semiconductor layer 16 and the first electrode 25, and improve an open circuit voltage of the back-contact solar cell.

In some cases, as shown in FIG. 13, the back-contact solar cell may further include a second electrode 26 formed on the second doped semiconductor layer 17, to lead out carriers collected by the second doped semiconductor layer 17 through the second electrode 26. Specifically, for a material of the second electrode 26, reference may be made to the material of the first electrode 25 described above, and details are not described herein again.

Based on the above, compared with existing back-contact solar cells including two types of doped semiconductor layers having opposite conductivity types and a same morphology, in the back-contact solar cell provided in this application, there is higher distinguishability between the first doped semiconductor layer and the second doped semiconductor layer, so that the difficulty in accurately arranging the conductive structures having the same polarities as the two types of doped semiconductor layers on the first doped semiconductor layer and the second doped semiconductor layer respectively can be reduced, and a risk of short circuit of the back-contact solar cell caused by coupling of the first doped semiconductor layer and the second doped semiconductor layer having opposite conductivity types through the conductive structures can be further reduced, thereby improving the electrical stability of the back-contact solar cell.

In addition, surfaces of both the first convex structure and the second convex structure are smoother than a surface of a textured structure. Therefore, compared with back-contact solar cells with the textured structure on a back surface, in the back-contact solar cell provided in this application, surfaces of the first doped semiconductor layer and the second doped semiconductor layer are smoother, facilitating deposition of a surface passivation layer on the surfaces of the two doped semiconductor layers. Therefore, the surface passivation layer forms a denser film with an improved passivation effect, thereby effectively improving an open circuit voltage of the back-contact solar cell and improving the photovoltaic conversion efficiency of the back-contact solar cell.

In an actual application process, the first convex structure may be a macrostructure arranged on the surface of the first region or may be a microstructure arranged on the surface of the first region.

When the first convex structure is a macrostructure, as shown by the parts (1) and (2) in FIG. 1, the surface of the first region 12 may be provided with first grid-shaped grooves recessed toward the semiconductor substrate 11; and the first convex structure 14 is located in a grid region encircled by the first grid-shaped grooves. In this case, in an actual manufacturing process of the back-contact solar cell provided in the embodiments of this application, the first grid-shaped grooves recessed toward the semiconductor substrate 11 may be provided through manners such as laser etching on the first region, so that a part of the first region located on inner sides of the first grid-shaped grooves forms the first convex structure 14. In this case, each convex distributed in the first convex structure 14 is obvious, helping distinguish a specific formation position of the first doped semiconductor layer through the first convex structure 14. Specifically, a width and a depth of each of the first grid-shaped grooves may be determined according to a requirement on the size of the first region 12 and the side length and the height of each convex distributed in the first convex structure 14, and are not specifically limited herein.

In another possible implementation, when the first convex structure is a microstructure, the first convex structure may be a first pyramid base structure obtained through polishing treatment. In this case, the first convex structure may be obtained by performing polishing treatment on a regular pyramid structure originally formed on the surface of the first region and removing an upper half part of the regular pyramid structure, to obtain the first pyramid base structure. Compared with the first convex structure located in the grid region encircled by the first grid-shaped grooves, the first pyramid base structure is a microstructure. Therefore, when the first convex structure is the first pyramid base structure obtained through polishing treatment, thinning to a thickness of the semiconductor substrate for forming the first convex structure on the surface of the first region may be reduced, so that a probability that light is absorbed after being incident to the semiconductor substrate is further increased while production of a thin back-contact solar cell is implemented, thereby improving the photovoltaic conversion efficiency of the back-contact solar cell.

Similarly, in an actual application process, the second convex structure may be a macrostructure arranged on the surface of the second region or may be a microstructure arranged on the surface of the second region.

When the second convex structure is a macrostructure, as shown by the parts (1) and (2) in FIG. 1, the surface of the second region 13 may be provided with second grid-shaped grooves recessed toward the semiconductor substrate 11; and the second convex structure 15 is located in a grid region encircled by the second grid-shaped grooves. For beneficial effects in this case, reference may be made to the analysis of the beneficial effects of the first grid-shaped grooves above, and details are not described herein again. Specifically, a width and a depth of each of the second grid-shaped grooves may be determined according to a requirement on the size of the second region 13 and the side length and the height of each convex distributed in the second convex structure 15, and are not specifically limited herein.

In another possible implementation, when the second convex structure is a microstructure, the second convex structure may be a second pyramid base structure obtained through polishing treatment. For beneficial effects in this case, reference may be made to the analysis of the beneficial effects of the first pyramid base structure above, and details are not described herein again.

In a possible implementation, referring to FIG. 6 to FIG. 9, as described above, in the case that the shape of the surface of each convex distributed in the first convex structure facing away from the semiconductor substrate is a first quasi-polygon and the shape of the surface of each convex distributed in the second convex structure facing away from the semiconductor substrate is a second quasi-polygon, the side length of the first quasi-polygon is less than the side length of the second quasi-polygon. In addition, the height of each convex distributed in the first convex structure 14 is greater than the height of each convex distributed in the second convex structure 15. In this case, when distinguishing is performed by comparing sizes of quasi-polygons corresponding to the convexes included in the regions on a back surface of the back-contact solar cell, a region corresponding to a smaller quasi-polygon is the formation position of the first doped semiconductor layer 16; and a region corresponding to a larger quasi-polygon is the formation position of the second doped semiconductor layer 17. In addition, the surface of the second region 13 having the second convex structure 15 is smoother than the surface of the first region 12 having the first convex structure 14, so that a passivation effect of the surface passivation layer to a surface of the second doped semiconductor layer 17 can be enhanced, thereby further improving the photovoltaic conversion efficiency of the back-contact solar cell. For example, different side lengths of the quasi-polygons in the first convex structure 14 and the second convex structure 15 can be compatible to different doping concentrations and/or different passivation layers of the first region 12 and the second region 13. In addition, when distinguishing is performed by comparing a difference between heights corresponding to the convexes included in the surfaces of the regions on the back surface of the back-contact solar cell, a region corresponding to a greater convex height is the formation position of the first doped semiconductor layer 16; and a region corresponding to a smaller convex height is the formation position of the second doped semiconductor layer 17, so that the first doped semiconductor layer 16 and the second doped semiconductor layer 17 can be distinguished from each other easily. In addition, the first convex structure 14 and the second convex structure 15 can respectively be the first pyramid base structure and the second pyramid base structure obtained through polishing treatment. Based on this, for beneficial effects in this case, reference may be made to the beneficial effects when the side length of the first quasi-polygon is less than the side length of the second quasi-polygon described above, and details are not described herein again.

It should be noted that, in an actual application process, the side length of the second quasi-polygon may alternatively be less than the side length of the first quasi-polygon. In addition, specific values of the side length of the first quasi-polygon and the side length of the second quasi-polygon may be set according to an actual requirement, and are not specifically limited herein.

In addition, in an actual application process, the height of each convex distributed in the second convex structure may be less than the height of each convex distributed in the first convex structure. Specific values of the heights of the convexes distributed in the first convex structure and the second convex structure may be set according to an actual requirement, and are not specifically limited herein.

For example, the side length of the first quasi-polygon may range from 0.5 μm to 20 μm; and the height of each convex distributed in the first convex structure ranges from 0.5 μm to 5 μm. In this case, in an actual manufacturing process, when treatment such as polishing is at least performed on the surface of the first region to form the first convex structure, the side length of the first quasi-polygon has a specific optional range, so that there is no need to impose a strict requirement on treatment conditions such as a polishing time to process a side length of each convex on the surface of the first region to a fixed value, thereby reducing the difficulty of the treatment such as polishing. In addition, compared with a convex with a nano-sized side length, the first quasi-polygon has a micron-sized side length, so that the morphology of the first region is more obvious, and the specific formation positions of the first doped semiconductor layer and the second doped semiconductor layer can be distinguished from each other more easily. For beneficial effects of setting the height of each convex distributed in the first convex structure to 0.5 μm to 5 μm, reference may be made to the beneficial effects when the side length of each convex distributed in the first convex structure ranges from 0.5 μm to 20 μm described above, and details are not described herein again.

For example, the side length of each convex distributed in the second convex structure ranges from 10 μm to 50 μm; and the height of each convex distributed in the second convex structure ranges from 0.5 μm to 10 μm. In this case, when the second doped semiconductor layer is formed on the second convex structure, a thickness of the second doped semiconductor layer generally ranges from 20 nm to 600 nm. The side length of each convex on the second region ranges from 10 μm to 50 μm, and the side length is far greater than the thickness of the second doped semiconductor layer. Based on this, no matter whether the second doped semiconductor layer is formed in or on the second region, the surface of the second doped semiconductor layer facing away from the semiconductor substrate has an obvious convex morphology, helping improve the distinguishability of the formation position of the second doped semiconductor layer. For beneficial effects of setting the height of each convex distributed in the second convex structure to 0.5 μm to 10 μm, reference may be made to the beneficial effects when the side length of each convex distributed in the second convex structure ranges from 10 μm to 50 μm described above, and details are not described herein again.

In an example, as shown in FIG. 6 to FIG. 9, in a case that the side length of the first quasi-polygon is less than the side length of the second quasi-polygon, the doping concentration of the first doped semiconductor layer 16 is less than the doping concentration of the second doped semiconductor layer 17. As such, the doping and passivation performances can be balanced across the first region 12 and the second region 13. For example, the first doped semiconductor layer 16 in the first region 12 has a higher doping concentration, which may have a higher Auger combination rate. By having first quasi-polygons with larger side length and larger size in the first convex structure 14, the passivation layer in the first region 12 can have a better passivation effect to reduce the recombination rate. Further, dopant in the first region 12 can be more uniformly attached, so as to reduce the formation of areas with extremely high doping concentration and therefore extremely high recombination rate. On the other hand, the second doped semiconductor layer 17 in the second region 13 has a lower doping concentration and a lower recombination rate. The second quasi-polygons of the second convex structure can have a smaller side length and a smaller size. In a case that the foregoing technical solution is used, within a specific range, contact resistance between a doped semiconductor layer and a conductive structure is inversely correlated with a doping concentration of the doped semiconductor layer. In some implementations, because the side length of the second quasi-polygon is greater than the side length of the first quasi-polygon, the surface of the second region having the second convex structure is smoother than the surface of the first region having the first convex structure, so that the surface of the second doped semiconductor layer is smoother than the surface of the first doped semiconductor layer. A smooth surface corresponds to a small specific surface area. In some implementations, after a passivation material for manufacturing the surface passivation layer is deposited, a thickness of the passivation material on the second doped semiconductor layer is greater than a thickness of the passivation material on the first doped semiconductor layer. In other words, as shown in FIG. 13, a thickness of the surface passivation layer 24 on the second doped semiconductor layer 17 with a greater doping concentration is greater than a thickness of the surface passivation layer on the first doped semiconductor layer 16 with a smaller doping concentration. Based on this, when elements in an electrode are subsequently diffused as doping elements into the first doped semiconductor layer 16 by sintering the electrode to increase the doping concentration of the first doped semiconductor layer 16 and reduce contact resistance between the first doped semiconductor layer 16 and a corresponding conductive structure, the thickness of the surface passivation layer 24 on the second doped semiconductor layer 17 is large, so that a problem that a part of the surface passivation layer 24 on the second doped semiconductor layer 17 is prematurely burnt through due to a long sintering time or a high sintering temperature can be resolved, thereby ensuring good contact of the first doped semiconductor layer 16 and the second doped semiconductor layer 17 and improving the electrical performance of the back-contact solar cell. It may be understood that, in a case that the side length of the first quasi-polygon is greater than the side length of the second quasi-polygon, the doping concentration of the first doped semiconductor layer is greater than the doping concentration of the second doped semiconductor layer, and the foregoing effects can also be achieved.

It should be noted that, as described above, when the first convex structure and the second convex structure are respectively the first pyramid base structure and the second pyramid base structure obtained through polishing treatment, because the height is inversely proportional to the side length of each of the first pyramid base structure and the second pyramid base structure, in a case that the height of each convex distributed in the first convex structure is greater than the height of each convex distributed in the second convex structure; or in a case that the side length of the first quasi-polygon is less than the side length of the second quasi-polygon and the height of each convex distributed in the first convex structure is greater than the height of each convex distributed in the second convex structure, by setting the doping concentration of the first doped semiconductor layer to be less than the doping concentration of the second doped semiconductor layer, the foregoing beneficial effects can also be achieved.

On the contrary, when the first convex structure and the second convex structure are respectively the first pyramid base structure and the second pyramid base structure obtained through polishing treatment, in a case that the height of each convex distributed in the first convex structure is greater than the height of each convex distributed in the second convex structure; or in a case that the side length of the first quasi-polygon is greater than the side length of the second quasi-polygon and the height of each convex distributed in the first convex structure is less than the height of each convex distributed in the second convex structure, by setting the doping concentration of the first doped semiconductor layer to be greater than the doping concentration of the second doped semiconductor layer, the foregoing effects can also be achieved.

When the doping concentration of the first doped semiconductor layer is different from the doping concentration of the second doped semiconductor layer, a doping concentration difference between the two doped semiconductor layers may be determined according to a doping process. For example, in a case that a diffusion process is used, the first doped semiconductor layer is doped through a phosphorus element, and the second doped semiconductor layer is doped through a boron element, the doping concentration of the first doped semiconductor layer may range from $10^{18}$ cm$^{-3}$ to $10^{20}$ cm$^{-3}$, and the doping concentration of the second doped semiconductor layer may range from $10^{17}$ cm$^{-3}$ to $10^{19}$ cm$^{-3}$.

In an example, as shown in FIG. 6 to FIG. 9, the first convex structure 14 and the second convex structure 15 each include a top surface and a bottom surface opposite to the top surface; and a surface of each of the first convex structure 14 and the second convex structure 15 facing away from the semiconductor substrate 11 is defined as the top surface. Based on this, in a case that the side length of the first quasi-polygon is less than the side length of the second quasi-polygon, as shown in FIG. 11, the top surface of the second convex structure 15 is recessed toward the semiconductor substrate 11 relative to the top surface of the first convex structure 14.

Figure 11:
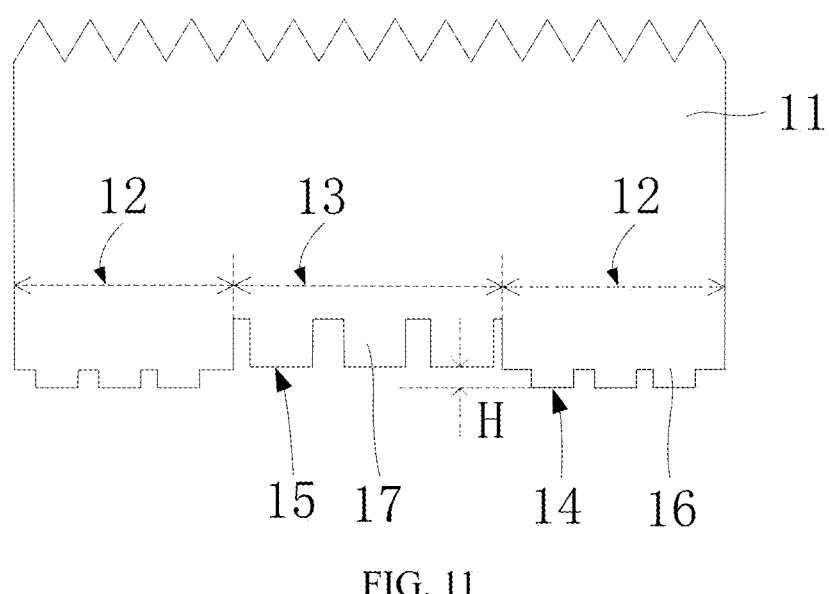
FIG. 11 is a schematic longitudinal cross-sectional view of a sixth structure of a back-contact solar cell according to an embodiment of this application.

In a case that the foregoing technical solution is used, as shown in FIG. 11, the top surface of the second convex structure 15 is recessed toward the semiconductor substrate 11 relative to the top surface of the first convex structure 14. In this case, the surface of the first convex structure 14 facing away from the semiconductor substrate 11 is higher than the surface of the second convex structure 15 facing away from the semiconductor substrate 11 by a height H, so that the surface of the second doped semiconductor layer 17 facing away from the semiconductor substrate 11 is also recessed inward toward the semiconductor substrate 11 relative to a surface of the first doped semiconductor layer 16 facing away from the semiconductor substrate 11. Based on this, as shown in FIG. 12, even when the side length of the first quasi-polygon is less than the side length of the second quasi-polygon, leading to that the thickness of the surface passivation layer 24 on the second doped semiconductor layer 17 is greater than the thickness of the surface passivation layer on the first doped semiconductor layer 16, a height difference between surfaces of parts of the surface passivation layer 24 on the first region 12 and the second region 13 can also be eliminated by recessing the surface of the second doped semiconductor layer 17 facing away from the semiconductor substrate 11 inward toward the semiconductor substrate 11 relative to the surface of the first doped semiconductor layer 16 facing away from the semiconductor substrate 11. In the foregoing case, when electrode windows are provided on the parts of the surface passivation layer 24 on the two regions through laser etching, gaps between a laser lens and the parts of the surface passivation layer 24 on the two regions are the same, so that etching can be performed on the parts of the surface passivation layer 24 on the two regions under the same depth of focus. Therefore, a problem in the related art that one type of electrode windows cannot be opened and the other type of electrode windows are over-etched since depths of focus of the two parts cannot be met simultaneously during laser etching due to the height difference between the surfaces of the parts of the surface passivation layer 24 on the two regions can be resolved. Correspondingly, as shown in FIG. 13, the first electrode 25 and the second electrode 26 subsequently formed may respectively run through the surface passivation layer 24 through corresponding types of electrode windows, thereby reducing contact resistance at the first electrode 25 and the second electrode 26. In addition, the first electrode 25 and the second electrode 26 subsequently formed do not extend into doped semiconductor layers having corresponding conductivity types, thereby ensuring that carrier recombination rates at both the first electrode 25 and the second electrode 26 are low and improving the photovoltaic conversion efficiency of the back-contact solar cell.

It may be understood that, in a case that the side length of the first quasi-polygon is greater than the side length of the second quasi-polygon, the top surface of the first convex structure is recessed toward the semiconductor substrate relative to the top surface of the second convex structure, and the foregoing effect can also be achieved.

It should be noted that, when the first convex structure and the second convex structure are respectively the first pyramid base structure and the second pyramid base structure obtained through polishing treatment, because the height is inversely proportional to the side length of each of the first pyramid base structure and the second pyramid base structure, in a case that the height of each convex distributed in the first convex structure is greater than the height of each convex distributed in the second convex structure; or in a case that the side length of the first quasi-polygon is less than the side length of the second quasi-polygon and the height of each convex distributed in the first convex structure is greater than the height of each convex distributed in the second convex structure, the top surface of the second convex structure is recessed toward the semiconductor substrate relative to the top surface of the first convex structure, and the foregoing effect can also be achieved.

On the contrary, when the first convex structure and the second convex structure are respectively the first pyramid base structure and the second pyramid base structure obtained through polishing treatment, in a case that the height of each convex distributed in the first convex structure is less than the height of each convex distributed in the second convex structure; or in a case that the side length of the first quasi-polygon is greater than the side length of the second quasi-polygon and the height of each convex distributed in the first convex structure is less than the height of each convex distributed in the second convex structure, the top surface of the first convex structure is recessed toward the semiconductor substrate relative to the top surface of the second convex structure, and the foregoing effects can also be achieved.

A height difference between the top surface of the first convex structure and the top surface of the second convex structure may be determined according to a difference between thicknesses of the surface passivation layer on the two convex structures, and is not specifically limited herein. For example, the height difference between the top surface of the first convex structure and the top surface of the second convex structure may range from 0.5 μm to 20 μm.

In a possible implementation, each convex distributed in the first convex structure and each convex distributed in the second convex structure both include a top surface and a bottom surface opposite to the top surface. In addition, a surface of each convex distributed in the first convex structure and each convex distributed in the second convex structure facing away from the semiconductor substrate is defined as the top surface. In this case, an area of the top surface of each convex distributed in the first convex structure is smaller than an area of the bottom surface of the convex; and an area of the top surface of each convex distributed in the second convex structure is smaller than an area of the bottom surface of the convex. In this case, when the area of the top surface of each convex distributed in the first convex structure is smaller than the area of the bottom surface the convex, a gap between tops of adjacent convexes distributed in the first convex structure is greater than a gap between bottoms of the convexes. In this way, an etching agent used for etching to form the first convex structure and reaction impurities are completely discharged from the adjacent convexes after the first convex structure is formed on the surface of the first region, so that problems such as current leakage caused by the etching agent and the reaction impurities remaining between the adjacent convexes are prevented, thereby improving the electrical performance of the back-contact solar cell. In addition, for beneficial effects of setting the area of the top surface of each convex distributed in the second convex structure to be less than the area of the bottom surface of the convex, reference may be made to the analysis of the beneficial effects when the area of the top surface of each convex distributed in the first convex structure is smaller than the area of the bottom surface of the convex, and details are not described herein again.

Specifically, a difference between the area of the top surface and the area of the bottom surface of each of the convexes distributed in the first convex structure and the second convex structure may be set according to an actual requirement, and is not specifically limited herein. It may be understood that, in a case that other factors are the same, a smaller difference between an area of a top surface and an area of a bottom surface of a convex indicates a smoother surface of a region on which the convex is formed, helping improve a passivation effect of the surface passivation layer to the surface of the region.

In addition, in this implementation, a shape of each of the top surface and the bottom surface of each of the convexes distributed in the first convex structure and the second convex structure may be a quasi-polygon such as a regular triangle, a square, or a rhombus, or may be a non-quasi-polygon such as a circle or an ellipse. In addition, the shape of the top surface and the shape of the bottom surface of each convex distributed in the first convex structure may be the same or may be different; and the shape of the top surface and the shape of the bottom surface of each convex distributed in the second convex structure may be the same or may be different. When the shapes of the top surface and the bottom surface of each of the convexes distributed in the first convex structure and the second convex structure are quasi-polygons, each convex distributed in the first convex structure and each convex distributed in the second convex structure both have a regular quasi-prism morphology. Compared with a first region and a second region having convexes with an irregular morphology, surfaces of the first region and the second region having convexes with the regular quasi-prism morphology are flatter, helping improve the compactness of the parts of the surface passivation layer formed on the first region and the second region, thereby improving a passivation effect of the surface passivation layer to the two regions and further improving the photovoltaic conversion efficiency of the back-contact solar cell.

Figure 10:
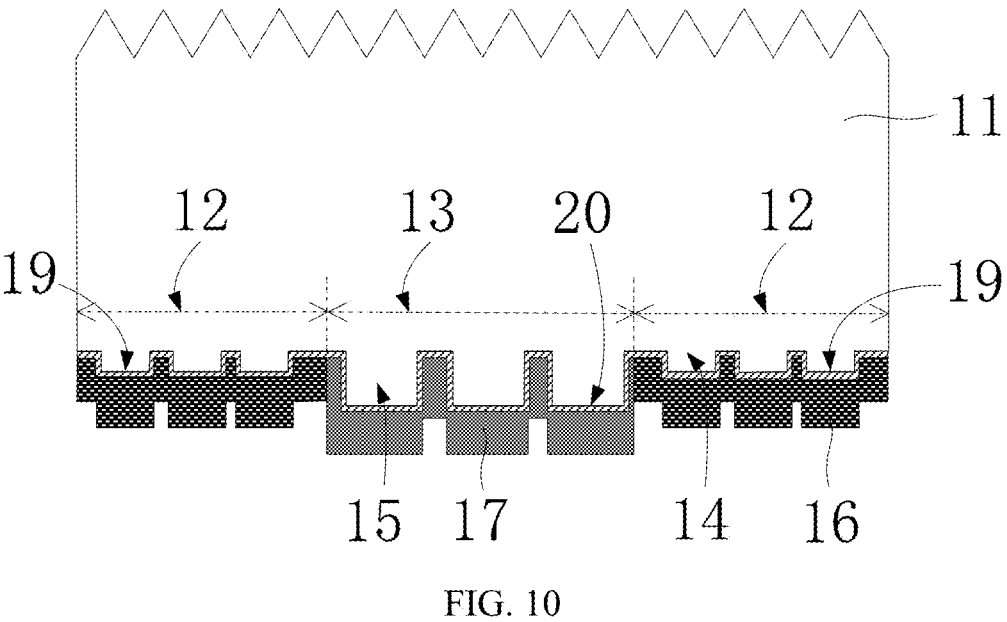
FIG. 10 is a schematic longitudinal cross-sectional view of a fifth structure of a back-contact solar cell according to an embodiment of this application.

In a possible implementation, as shown in FIG. 10, when the first doped semiconductor layer 16 is formed on the first region 12, the back-contact solar cell further includes a first tunneling passivation layer 19 located between the first convex structure 14 and the first doped semiconductor layer 16. In this case, the first tunneling passivation layer 19 may form a tunneling passivation contact structure with the first doped semiconductor layer 16. In the tunneling passivation contact structure, the first tunneling passivation layer 19 allows most carriers to tunnel into the first doped semiconductor layer 16 and blocks a few carriers from passing through, and the most carriers are transmitted by the second doped semiconductor layer 17 and collected by a corresponding conductive structure. Therefore, recombination rates of carriers having different conductivity types on the surface of the first region 12 are reduced, and excellent interface passivation and selective collection of carriers are implemented, thereby further improving the photovoltaic conversion efficiency of the back-contact solar cell.

Specifically, a material and a thickness of the first tunneling passivation layer may be set according to an actual requirement, and are not specifically limited herein. For example, the material of the first tunneling passivation layer may be a material such as silicon oxide, aluminum oxide, titanium oxide, hafnium dioxide, gallium oxide, tantalum pentoxide, niobium pentoxide, silicon nitride, silicon carbonitride, aluminum nitride, titanium nitride, or titanium carbonitride. The thickness of the first tunneling passivation layer may range from 0.5 nm to 5 nm.

In a possible implementation, as shown in FIG. 10, when the second doped semiconductor layer 17 is formed on the second region 13, the back-contact solar cell further includes a second tunneling passivation layer 20 located between the second convex structure 15 and the second doped semiconductor layer.

Specifically, for a material and a thickness of the second tunneling passivation layer, reference may be made to the material and the thickness of the first tunneling passivation layer described above, and details are not described herein again.

Figure 14:
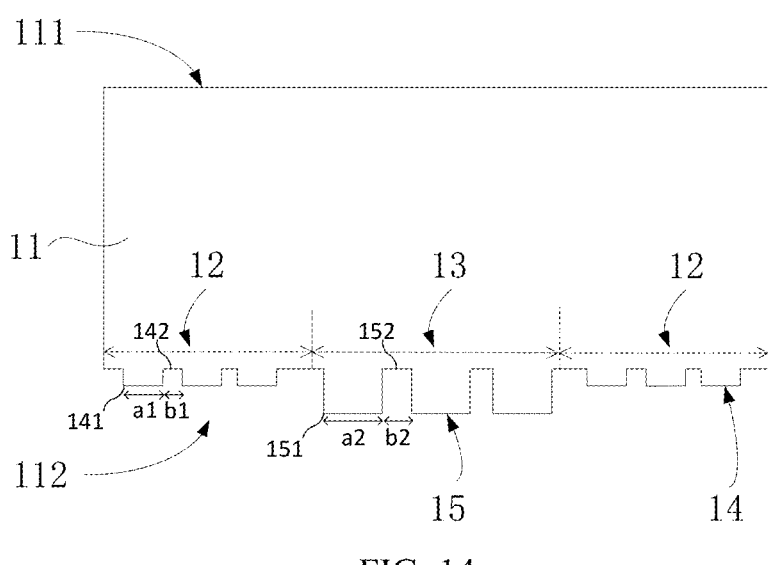
FIG. 14 is a schematic longitudinal cross-sectional view of a first structure of a semiconductor substrate according to an embodiment of this application.

In some cases, as shown in FIG. 14, the first convex structure 14 can include a plurality of first convexes 141 protruding away from the silicon substrate 11, and a plurality of first concaves 142 recessed towards the silicon substrate 11. A surface of each of the plurality of first convexes 141 and the plurality of first concaves 142 can be a quasi-polygon. In some implementations, the quasi-polygon of the first convex 141 can have a similar size as the quasi-polygon of the adjacent first concave 142. For example, a side length of the quasi-polygon of the first convex 141 is a1, a side length of the quasi-polygon of the first concave 142 is b1, and 0.5b1<a1<1.5b1. In some implementations, 0.8b1<a1<1.2b1. In some implementations, a1 and b1 are substantially the same.

Similarly, the second convex structure 15 can include a plurality of second convexes 151 protruding away from the silicon substrate 11, and a plurality of second concaves 152 recessed towards the silicon substrate 11. A surface of each of the plurality of second convexes 151 and the plurality of second concaves 152 can be a quasi-polygon. In some implementations, the quasi-polygon of the second convex 151 can have a similar size as the quasi-polygon of the adjacent second concave 152. For example, a side length of the quasi-polygon of the second convex 151 is a2, a side length of the quasi-polygon of the second concave 152 is b2, and 0.5b2<a2<1.5b2. In some implementations, 0.8b2<a2<1.2b2. In some implementations, a2 and b2 are substantially the same.

In some implementations, the size of the quasi-polygon of the first convex 141 is smaller than the size of the quasi-polygon of the second convex 151, and the size of the quasi-polygon of the first concave 142 is smaller than the size of the quasi-polygon of the second concave 152. That is, a2>a1, and b2>b1.

In some implementations, a2>1.5a1, and b2>1.5b1. As such, the first region 12 having the first convex structure 14 and the second region 13 having the second convex structure 15 can be compatible with different fabrication processes. For example, the fabrication process to form the doped semiconductor layer in one region may require one photolithography procedure, while the fabrication process to form the doped semiconductor layer in the other region may require two photolithography procedures. Further, the first region 12 and the second region 13 can satisfy different passivation needs. For example, passivation of one region may be achieved through field passivation, while passivation of the other region may be achieved through chemical passivation. As a result, the output power and the efficiency of the solar cell can be improved. In some implementations, the first doped semiconductor layer (e.g., the first doped semiconductor layer 16 of FIGS. 6-9) formed in or on the first region 12 having the first convex structure 14 can be an N-type semiconductor layer, and the second doped semiconductor layer (e.g., the second doped semiconductor layer 17 of FIGS. 6-9) formed in or on the second region 13 having the second convex structure 15 can be a P-type semiconductor layer. Alternatively, the first doped semiconductor layer formed in or on the first region 12 having the first convex structure 14 can be a P-type semiconductor layer, and the second doped semiconductor layer formed in or on the second region 13 having the second convex structure 15 can be an N-type semiconductor layer.

By having adjacent convexes and concaves of similar size in each of the first convex structure 14 and the second convex structure 15 (e.g., such that when the size of the quasi-polygon of the first convex 141 is smaller than the size of the quasi-polygon of the second convex 151, the size of the quasi-polygon of the first concave 142 is also smaller than the size of the quasi-polygon of the second concave 152), during doping processes, dopants can be attached uniformly in each of the first region 12 and the second region 13, which can reduce the formation of areas with extremely high doping concentration and therefore extremely high recombination rate. As such, each of the first doped semiconductor layer 16 and the second doped semiconductor layer 17 can be uniformly doped. Further, the passivation layer in each of the first region 12 and the second region 13 can be uniformly formed, which can improve the passivation performance.

The foregoing description is merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

The apparatus embodiments described above are merely examples. The units described as separate parts may or may not be physically separate, and the parts displayed as units may or may not be physical units, may be located in one position, or may be distributed on a plurality of network units. Some of or all of the modules may be selected according to an actual requirement for achieving the objectives of the solutions of the embodiments. A person of ordinary skill in the art may understand and implement the embodiments without creative efforts.

Throughout the specification, "one embodiment", "an embodiment", or "one or more embodiments" means that specific features, structures, or characteristics described with reference to the embodiments are included in at least one embodiment of this application. In addition, it should be noted that the wording example "in an embodiment" herein does not necessarily indicate a same embodiment.

Lots of specific details are described in the specification provided herein. However, it can be understood that, the embodiments of this application may be practiced without the specific details. In some examples, well-known methods, structures, and technologies are not shown in detail so as not to obscure the understanding of the specification.

Finally, it should be noted that the foregoing embodiments are merely used for describing the technical solutions of this application, but are not intended to limit this application. Although this application is described in detail with reference to the foregoing embodiments, it should be appreciated by a person of ordinary skill in the art that, modifications may still be made to the technical solutions recorded in the foregoing embodiments, or equivalent replacements may be made to some technical features; and these modifications or replacements will not cause the essence of corresponding technical solutions to depart from the spirit and scope of the technical solutions in the embodiments of this application.

What is claimed is:

1. A back-contact solar cell, comprising:
    a semiconductor substrate having a first surface and a second surface opposite to the first surface, wherein the second surface comprises a first region and a second region arranged in a direction of the second surface, and an isolation region between the first region and the second region, wherein a surface of the first region has a first convex structure, and a surface of the second region has a second convex structure, wherein a morphology of the first convex structure is different from a morphology of the second convex structure;
    a first doped semiconductor layer, formed on the first region, wherein the first doped semiconductor layer is on the first convex structure; and
    a second doped semiconductor layer, formed on the second region, wherein the second doped semiconductor layer is on the second convex structure, wherein a conductivity type of the second doped semiconductor layer is opposite to a conductivity type of the first doped semiconductor layer, wherein a side length of a first convex of the first convex structure is less than a side length of a second convex of the second convex structure, and wherein a doping concentration of the first doped semiconductor layer is lower than a doping concentration of the second doped semiconductor layer;

a passivation layer covering the first doped semiconductor layer and the second doped semiconductor layer, wherein a first portion of the passivation layer is on the first doped semiconductor layer, and a second portion of the passivation layer is on the second doped semiconductor layer, and wherein a thickness of the second portion of the passivation layer is greater than a thickness of the first portion of the passivation layer;

a first electrode on the first doped semiconductor layer; and a second electrode on the second doped semiconductor layer, wherein the first electrode and the second electrode comprise a conductive material.

2. The back-contact solar cell according to claim 1, wherein the second surface comprises more than one first region and more than one second region alternatively arranged along the direction of the second surface.

3. The back-contact solar cell according to claim 1, wherein the first convex structure comprises a first pyramid base structure obtained through polishing treatment, and wherein the second convex structure comprises a second pyramid base structure obtained through polishing treatment.

4. The back-contact solar cell according to claim 1, wherein a surface of the first convex structure facing away from the semiconductor substrate is in a shape of one or more first polygons, wherein a surface of the second convex structure facing away from the semiconductor substrate is in a shape of one or more second polygons.

5. The back-contact solar cell according to claim 4, wherein a side length of a first polygon of the one or more first polygons is different from a side length of a second polygon of the one or more second polygons.

6. The back-contact solar cell according to claim 5, wherein the side length of the first polygon ranges from 0.5 $\mu$m to 20 $\mu$m, the side length of the second polygon ranges from 10 $\mu$m to 50 $\mu$m.

7. The back-contact solar cell according to claim 1, wherein a height of the first convex of the first convex structure is different from a height of the second convex of the second convex structure.

8. The back-contact solar cell according to claim 5, wherein the side length of the first polygon is less than the side length of the second polygon, and a height of the first convex is greater than a height of the second convex.

9. The back-contact solar cell according to claim 7, wherein the height of the first convex of first convex structure ranges from 0.5 $\mu$m to 5 $\mu$m, and the height of the second convex of the second convex structure ranges from 0.5 $\mu$m to 10 $\mu$m.

10. The back-contact solar cell according to claim 4, wherein the first convex structure and the second convex structure each comprise a top surface facing away from the semiconductor substrate and a bottom surface opposite to the top surface, and wherein a side length of a first polygon of the one or more first polygons is less than a side length of a second polygon of the one or more second polygons, and the top surface of the second convex structure is closer to the first surface of the semiconductor substrate than the top surface of the first convex structure.

11. The back-contact solar cell according to claim 1, wherein the first convex of the first convex structure comprises a top portion and a bottom portion that is further away from the first doped semiconductor layer than the top portion, wherein the second convex of the second convex structure comprises a top portion and a bottom portion that is further away from the second doped semiconductor layer than the top portion, wherein an area of the top portion of the first convex is smaller than an area of the bottom portion of the first convex, and wherein an area of the top portion of the second convex is smaller than an area of the bottom portion of the second convex.

12. The back-contact solar cell according to claim 11, wherein a cross section of the top portion and a cross section of the bottom portion of the first convex are in a shape of a polygon, and wherein a cross section of the top portion and a cross section of the bottom portion of the second convex are in a shape of a polygon.

13. The back-contact solar cell according to claim 1, wherein a surface of the isolation region has one of a regular pyramid textured structure, or an inverted pyramid textured structure.

14. The back-contact solar cell according to claim 1, wherein the first convex structure comprises a first convex and a first concave adjacent to the first convex, wherein the second convex structure comprises a second convex and a second concave adjacent to the second convex, wherein a surface of each of the first convex, the first concave, the second convex, and the second concave is in a shape of one or more polygons, wherein a side length of a polygon of the first convex is a1, a side length of a polygon of the first concave is b1, a side length of a polygon of the second convex is a2, and a side length of a polygon of the second concave is b2, and wherein $0.5b1<a1<1.5b1$, and $0.5b2<a2<1.5b2$.

15. The back-contact solar cell according to claim 14, wherein $a2>a1$, and $b2>b1$.

16. The back-contact solar cell according to claim 15, wherein $a2>1.5a1$, and $b2>1.5b1$.

17. The back-contact solar cell of claim 1, wherein the first convex structure comprises a plurality of first convexes protruding away from the semiconductor substrate, and the second convex structure comprises a plurality of second convexes protruding away from the semiconductor substrate, wherein a morphology of the first convex structure is different from the second convex structure.

18. The back-contact solar cell of claim 1, wherein a morphology of a surface of the first doped semiconductor layer facing away from the semiconductor substrate is different from a morphology of a surface of the second doped semiconductor layer facing away from the semiconductor substrate.

19. The back-contact solar cell of claim 1, wherein a surface of the second doped semiconductor layer facing away from the semiconductor substrate is closer to the semiconductor substrate than a surface of the first doped semiconductor layer facing away from the semiconductor substrate.

20. The back-contact solar cell of claim 1, wherein the first doped semiconductor layer and the second doped semiconductor layer comprise polycrystalline silicon.

21. The back-contact solar cell of claim 1, wherein a surface of the isolation region has a height difference relative to surfaces of the first region and the second region.

\* \* \* \* \*